United States Patent [19]
McClure

[11] Patent Number: 5,341,336
[45] Date of Patent: Aug. 23, 1994

[54] METHOD FOR STRESS TESTING DECODERS AND PERIPHERY CIRCUITS

[75] Inventor: David C. McClure, Carrollton, Tex.

[73] Assignee: SGS-Thomson Microelectronics, Inc., Carrollton, Tex.

[21] Appl. No.: 56,376

[22] Filed: Apr. 30, 1993

[51] Int. Cl.$^5$ .............................................. G11C 7/00
[52] U.S. Cl. .............................. 365/201; 365/189.05; 365/230.08
[58] Field of Search .............. 365/201, 230.08, 189.05, 365/230.08, 201

[56] References Cited

U.S. PATENT DOCUMENTS

| | | | |
|---|---|---|---|
| 4,651,304 | 3/1987 | Takata | 365/201 |
| 5,208,776 | 5/1993 | Nasu et al. | 365/200 |

Primary Examiner—Eugene R. LaRoche
Assistant Examiner—F. Niranjan
Attorney, Agent, or Firm—Kenneth C. Hill; Lisa K. Jorgenson; Richard K. Robinson

[57] ABSTRACT

A method for stress testing decoders and other periphery circuits used with a memory array. An address buffer simultaneously sets the inputs of a plurality of decoders to a first common voltage level, so that a plurality of rows and/or columns within the memory array are selected for a predetermined period of time. A stress voltage is then applied to the integrated circuit to stress test the gate oxides within the decoders and other periphery circuits. The inputs of the plurality of decoders are then simultaneously set to a second common voltage level, so that the plurality of rows and/or columns within the memory array are deselected. Finally, a stress voltage is applied to the integrated circuit to stress test the gate oxides within the decoders and other periphery circuits.

27 Claims, 1 Drawing Sheet

METHOD FOR STRESS TESTING DECODERS AND PERIPHERY CIRCUITS

BACKGROUND OF THE INVENTION

1. Field of the Invention

The present invention relates in general to integrated circuits, and more particularly to memory arrays in integrated circuits. Still more particularly, the present invention relates to a method for stress testing decoders and periphery circuits used with memory arrays.

2. Description of the Prior Art

Memory arrays use many different circuits in order to operate. For example, row decoders, column decoders, write decoders, pre-coding and post-coding circuits may be used. Stress testing of memory arrays, decoders and other periphery circuits used with memory arrays is typically accomplished by applying a stress voltage to the integrated circuit. Most latent defects within the memory array and various circuits are detected as a result of stress testing.

Stress testing of decoders and other periphery circuits used with memory arrays, however, is typically not performed due to the length of time required for testing. In order to stress test each gate in the decoders and other periphery circuits, each and every address combination must be selected individually. A stress voltage would then be applied to the integrated circuit. However, those skilled in the art will appreciate that selecting and stressing each and every address combination requires quite a bit of time. Consequently, stress testing of decoders and other periphery circuits is usually not performed.

For example, to test the decoders and other circuits used with a 128K by 8k memory array, 128,000 address combinations must be activated individually, and then set to a stress voltage. Understandably, cycling through 128,000 address combinations would be a very time consuming task. A result of not performing a stress test is that latent defects in the decoders and periphery circuitry go undetected. This results in the production of marginal memory arrays.

Therefore, it would be desirable to provide a method for stress testing decoders and other periphery circuits used with a memory array. It is also desirable that such a method not increase the complexity of the testing or fabrication of an integrated circuit.

SUMMARY OF THE INVENTION

A method is provided for stress testing decoders and other periphery circuits used with a memory array. An address buffer simultaneously sets the inputs of a plurality of decoders to a first common voltage level, so that a plurality of rows and/or columns within the memory array are selected for a predetermined period of time. A stress voltage is then applied to the integrated circuit to stress test the gate oxides within the decoders and other periphery circuits. The inputs of the plurality of decoders are then simultaneously set to a second common voltage level, so that the plurality of rows and/or columns within the memory array are deselected. Finally, a stress voltage is applied to the integrated circuit to stress test the gate oxides within the decoders and other periphery circuits.

BRIEF DESCRIPTION OF THE DRAWINGS

The novel features believed characteristic of the invention are set forth in the appended claims. The invention itself however, as well as a preferred mode of use, and further objects and advantages thereof, will best be understood by reference to the following detailed description of an illustrative embodiment when read in conjunction with the accompanying drawings, wherein:

DESCRIPTION OF THE PREFERRED EMBODIMENT

Figure 1:
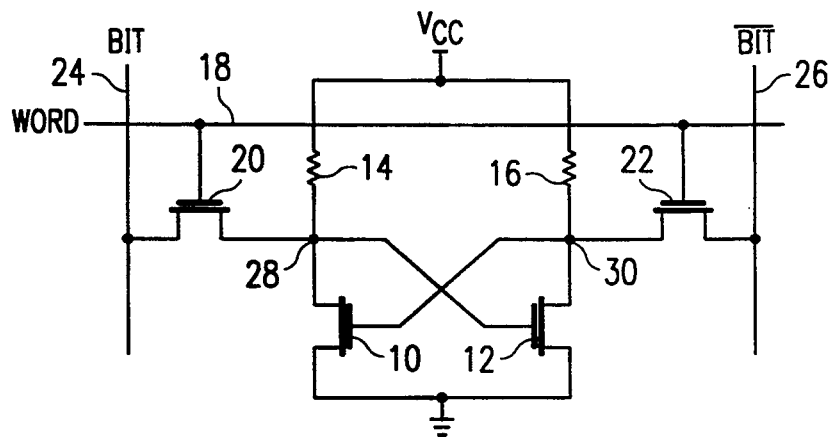
FIG. 1 is a circuit diagram illustrating a memory cell within a memory array.

Referring to FIG. 1, a circuit diagram of a memory cell is illustrated. As can be seen, a first transistor 10, a second transistor 12, a first load element 14, and a second load element 16 are arranged in a flip-flop configuration. In the preferred embodiment, load elements 14, 16 are resistors, but those skilled in the art will recognize that p-channel transistors may also be used for load elements 14, 16.

Row line 18, labeled word, is connected to the gate of a third transistor 20 and fourth transistor 22. Row line 18 is utilized to activate the cell. Signal lines 24, 26 labeled bit and bit bar, respectively, are then utilized to write data to and read data from the cell. In this manner, third and fourth transistor 20, 22 act as select transistors, and first transistor 10 and second transistor 12 are storage transistors.

Data is stored as voltage levels with the two sides of the flip-flop in opposite voltage configurations. The memory cell has two stable states, high or logic 1, and low or logic 0. If the memory cell is storing a logic 1, node 28 is high and node 30 is low, with first transistor 10 turned off and second transistor 12 turned on. The logic 0 state would be the opposite, with node 28 low and node 30 high.

Figure 2:
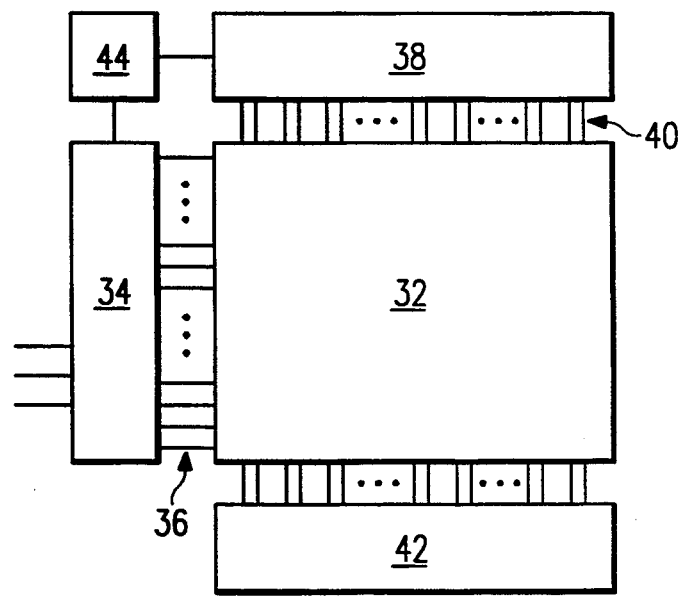
FIG. 2 is a block diagram illustrating a portion of the circuitry in a memory integrated circuit.

The memory cell illustrated in FIG. 1 is imbedded in an array of similar cells. FIG. 2 is a block diagram of the circuitry associated with a memory array in an integrated circuit according to the present invention. Memory array 32 is accessed by a row decoder 34 which selects a word line from a plurality of word lines 36. A column decoder 38 selects the appropriate bit and bit bar lines from a plurality of bit and bit bar lines 40. Write decoder 42 is utilized to write data into the memory array 32. Although column decoder 38 and write decoder 42 are depicted as separate circuits, those skilled in the art will recognize that column decoder 38 and write decoder 42 may be combined as one circuit. Furthermore, row decoder 34 and column decoder 38 may include pre-coding, coding and post-coding circuits.

A method for stress testing the decoders and periphery circuits used with the memory array 32 will now be described. Block 44 represents a plurality of address buffers which generate control signals used by row decoder 34 and/or column decoder 38. The control signals from block 44 cause row decoder 34 to simultaneously select all or a portion of the word lines within memory array 32. The control signals from block 44 are also used by column decoder 38 to simultaneously select all or a portion of the bit lines and complementary bit lines within memory array 32.

A stress voltage is then applied to the integrated circuit. The stress voltage is typically seven to ten volts. After a predetermined period of time has passed, address buffer 44 deselects the word, bit and complementary bit lines within memory array 32. The stress voltage is then applied a second time to the integrated circuit. By applying the stress voltage a second time to the integrated circuit, all of the nodes within the decoders and periphery circuits are stressed. In other words, applying the stress voltage when the word and bit lines are selected and then deselected insures that all of the p-channel transistors and n-channel transistors are stress tested throughout the decoding path.

If current transients are a concern, it is possible to start the stress test with $V_{CC}$ set to a low voltage level, and then ramp $V_{CC}$ up to a desired level. $V_{CC}$ should then be ramped down before switching between selected and deselected word and bit lines, and then ramped up again to apply the stress voltage. By ramping up the stress voltage, current transients are reduced. Another technique which reduces current transients is to select only the word lines, apply the stress voltage, then select the bit and complementary bit lines and apply the stress voltage a second time.

Furthermore, one or both of the bit line loads of a bit line pair may need to be turned off when multiple rows are selected. This avoids the creation of a high current path within the memory cell. Additionally, it may be desirable to pull the bit line load to ground.

One alternative method for stress testing the decoders and periphery circuits is to select and stress test only portions of memory array 32 at a time. For example, some of the word, bit and complementary bit lines may be selected at one time and stress tested according to the present invention. Next, a different portion of memory array 32 is selected and stress tested. This process continues until all of the decoders and periphery circuits have been stress tested. Depending on how the row decoder is set up, another alternative is to split memory array into quadrants. The word, bit and complementary bit lines in one quadrant of the array are selected and tested, and then another quadrant, and so on until all of the word, bit and complementary bit lines have been selected and deselected.

Figure 3:
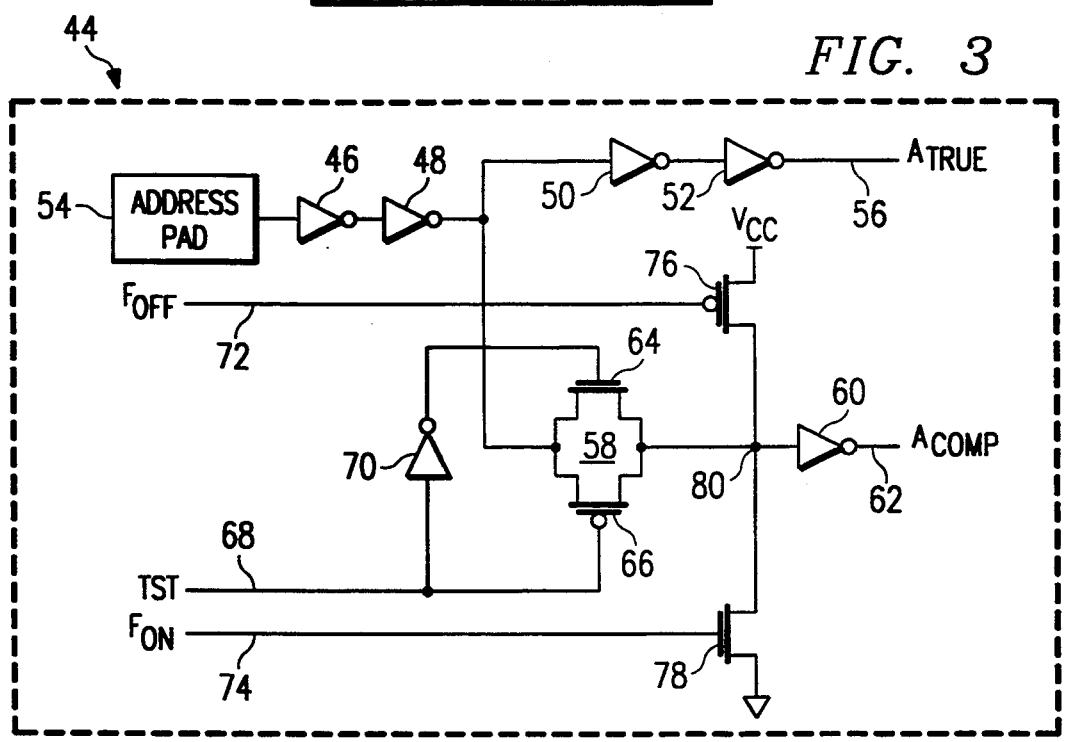
FIG. 3 is a circuit diagram illustrating a circuit which may be utilized with a method for stress testing decoders and periphery circuits according to the present invention.

FIG. 3 is a circuit diagram illustrating an address buffer which may be utilized with a method for stress testing decoders and periphery circuits according to the present invention. First inverter 46, second inverter third inverter 50, and fourth inverter 52 are connected in series between an address pad 54 and a first output signal line 56, labelled $A_{TRUE}$. Connected to the output of second inverter 48 is an input into pass gate 58. Fifth inverter 60 is connected between the output of pass gate 58 and second output signal line 62, labelled $A_{COMP}$. In the preferred embodiment, $A_{TRUE}$ and $A_{COMP}$ are inputs into an address decoder (not shown).

Inverters 46, 48, 50, 52 placed between address pad 54 and first output signal line 56 are used to build up the drive capability for the signal $A_{TRUE}$. Inverters 46, 48, 50, 52 also result in a time delay for $A_{TRUE}$. In the preferred embodiment, pass gate 58 is used between second inverter 48 and fifth inverter 60 to make the time delay for $A_{COMP}$ equal to the time delay of $A_{TRUE}$, and to optimize the crossing point of $A_{COMP}$ and $A_{TRUE}$ during the transition.

As known in the art, pass gate 58 is composed of an n-channel transistor 64 and a p-channel transistor 66 with a common source and drain. Signal 68, labelled TST, is used to control pass gate 58. When the signal on TST is low, p-channel transistor 66 is turned on. Additionally, sixth inverter 70 inverts the signal and n-channel transistor 64 is turned on. When both transistors are turned on, signal 72, labelled $F_{OFF}$, set high, and signal 74, labelled $F_{ON}$, set low, the pass gate conducts, and $A_{COMP}$ and $A_{TRUE}$ are complementary signals.

The integrated circuit is preferably in a testing or special operating mode when both $A_{COMP}$ and $A_{TRUE}$ are set to the same voltage level. To set both signals to the same voltage level, TST is set high. Address pad 54, signal 72, signal 74, pull up transistor 76 and pull down transistor 78 are then used to select the voltage level both $A_{COMP}$ and $A_{TRUE}$ are to be set to, as will be described in greater detail below.

For a first example, if both $A_{COMP}$ and $A_{TRUE}$ need to be high, a high voltage level is placed on address pad 54. This causes $A_{TRUE}$ to be a high voltage level. To get $A_{COMP}$ to be a high voltage level, $F_{OFF}$ and $F_{ON}$ are set to a high voltage level. This causes pull up transistor 76 to be turned off and pull down transistor 78 to be on. With pull down transistor 78 on, node 80 is set to a low voltage level, which fifth inverter 60 inverts to a high voltage level. Thus, both $A_{TRUE}$ and $A_{COMP}$ are set at a high voltage state.

If the address decoders (not shown) which have $A_{TRUE}$ and $A_{COMP}$ as inputs are composed of NAND gates, and these NAND gates are used to select rows in a memory array, then all of the NAND gates have a low voltage level as their output states. This causes all of the rows in the memory array to be activated. If NAND gates are also used as decoders for column selection in the memory array, then all of the columns in the memory array are activated in this same manner.

Alternatively, if both $A_{COMP}$ and $A_{TRUE}$ need to be at a low voltage level, a low voltage level is placed on address pad 54. This causes $A_{TRUE}$ to be a low voltage level. To get $A_{COMP}$ to be at a low voltage level, $F_{OFF}$ and $F_{ON}$ are set to a low voltage level. This causes pull up transistor 76 to be turned on and pull down transistor 78 to be turned off. With pull up transistor 76 on, node 80 is set to a high voltage level, which fifth inverter 60 inverts to a low voltage level. Thus, both $A_{TRUE}$ and $A_{COMP}$ are set at a low voltage state.

Continuing with this second example, if the address decoders (not shown) have $A_{TRUE}$ and $A_{COMP}$ as inputs are composed of NAND gates, and these NAND gates are used to select rows in a memory array, then all of the NAND gates have a high voltage level as their output states. This causes all of the rows in the memory array to not be activated. If the NAND gates are also used as decoders for column selection in the memory array, then all of the columns in the memory array are not activated in this same manner.

The above described method for stress testing decoders and periphery circuits used with memory arrays provides a method for detecting latent defects within the decoders and periphery circuits. The preferred method insures that all of the transistors, both p-channel and n-channel are stress tested by using signals composed of both a logic high and a logic low. Furthermore, the stress test described above saves time because every node within the decoders and periphery circuits are stress tested in two testing cycles.

Although the method has been described by selecting both row and columns in a memory array, stressing the integrated circuit, deselecting the rows and columns, and then stressing a second time, optional techniques of the preferred embodiment may be used. For example, the sequencing of the testing method may be altered. The rows may be selected, and then the columns, or vice versa. Only rows or columns may be selected and stressed at one time, or the stress voltage may be applied only once, during selection or deselection of rows and/or columns. In other words, the method described above may be changed to meet the needs of the user.

While the invention has been particularly shown and described with reference to a preferred embodiment, it will be understood by those skilled in the art that various changes in form and detail may be made therein without departing from the spirit and scope of the invention.

What is claimed is:

1. A method for stress testing decoders and periphery circuits used with a memory array in an integrated circuit, comprising the steps of:
   simultaneously setting the inputs of a plurality of row decoding circuits to a first common voltage level, wherein a plurality of rows within the memory array are selected for a predetermined period of time;
   applying a stress voltage to the integrated circuit;
   simultaneously setting the inputs of the plurality of row decoding circuits to a second common voltage level, wherein the plurality of rows within the memory array are deselected; and
   applying a stress voltage to the integrated circuit.

2. The method of claim 1, further comprising the step of placing the integrated circuit in a test or special operating mode prior to performing the step of simultaneously setting the inputs of a plurality of row decoding circuits to a first common voltage level.

3. The method of claim 1, wherein said step of simultaneously setting the inputs of the plurality of row decoding circuits to the first common voltage level further comprises the step of simultaneously setting the inputs of a plurality of column decoding circuits to the first common voltage level, wherein a plurality of bit and complementary bit lines within the memory array are selected for a predetermined period of time.

4. The method of claim 3, wherein the step of simultaneously setting the inputs of the plurality of row decoding circuits to the second common voltage level further comprises the step of simultaneously setting the inputs of a plurality of column decoding circuits to the second common voltage level, wherein the plurality of bit and complementary bit lines within the memory array are deselected.

5. The method of claim 1, wherein said step of simultaneously setting the inputs of the plurality of row decoding circuits to the first common voltage level comprises simultaneously setting the inputs of the plurality of row decoding circuits to a high voltage level.

6. The method of claim 5, wherein said step of simultaneously setting the inputs of the plurality of row decoding circuits to the second common voltage level comprises simultaneously setting the inputs of the plurality of row decoding circuits to a low voltage level.

7. A method for stress testing decoders and periphery circuits used with a memory array in an integrated circuit, comprising the steps of:
   simultaneously setting the inputs of a plurality of row decoding circuits to a first common voltage level, wherein a plurality of rows within the memory array are selected for a predetermined period of time, wherein a bit line load of a bit line pair is turned off during selection of a plurality of rows;
   applying a stress voltage to the integrated circuit;
   simultaneously setting the inputs of the plurality of row decoding circuits to a second common voltage level, wherein the plurality of rows within the memory array are deselected; and
   applying a stress voltage to the integrated circuit.

8. The method of claim 7, wherein the bit line load is pulled to ground after being turned off.

9. A method for stress testing decoders and periphery circuits used with a memory array in an integrated circuit, comprising the steps of:
   simultaneously setting the inputs of a plurality of row decoding circuits to a first common voltage level, wherein a plurality of rows within the memory array are selected for a predetermined period of time;
   applying a stress voltage to the integrated circuit;
   simultaneously setting the inputs of the plurality of row decoding circuits to a second common voltage level, wherein the plurality of rows within the memory array are deselected; and
   applying a stress voltage to the integrated circuit;
   wherein said steps of setting the inputs of a plurality of row decoding circuits or column decoding circuits are performed when the stress voltage is set to a low voltage level.

10. A method for stress testing decoders and periphery circuits used with a memory array in an integrated circuit, comprising the steps of:
    simultaneously setting the inputs of a plurality of column decoding circuits to a first common voltage level, wherein a plurality of bit and complementary bit lines within the memory array are selected for a predetermined period of time;
    applying a stress voltage to the integrated circuit;
    simultaneously setting the inputs of the plurality of column decoding circuits to a second common voltage level, wherein the plurality of bit and complementary bit lines within the memory array are deselected; and
    applying a stress voltage to the integrated circuit.

11. The method of claim 10, further comprising the step of placing the integrated circuit in a test or special operating mode prior to performing the step of simultaneously setting the inputs of a plurality of column decoding circuits to a first common voltage level.

12. The method of claim 10, wherein said step of simultaneously setting the inputs of the plurality of column decoding circuits to the first common voltage level further comprises the step of simultaneously setting the inputs of a plurality of row decoding circuits to the first common voltage level, wherein a plurality of rows within the memory array are selected for a predetermined period of time.

13. A method for stress testing decoders and periphery circuits used with a memory array in an integrated circuit, comprising the steps of:
    simultaneously setting the inputs of a plurality of column decoding circuits to a first common voltage level, wherein a plurality of bit and complementary bit lines within the memory array are selected for a predetermined period of time and simultaneously setting the inputs of a plurality of row decoding circuits to the first common voltage level, wherein a plurality of rows within the memory array are selected for a predetermined period of time;

applying a stress voltage to the integrated circuit;

simultaneously setting the inputs of the plurality of column decoding circuits to a second common voltage level, wherein the plurality of bit and complementary bit lines within the memory array are deselected; and applying a stress voltage to the integrated circuit;

wherein a bit line load of a bit line pair is turned off during selection of the plurality of rows.

14. The method of claim 13, wherein the bit line load is pulled to ground after being turned off.

15. The method of claim 12, wherein the step of simultaneously setting the inputs of the plurality of column decoding circuits to the second common voltage level further comprises the step of simultaneously setting the inputs of a plurality of row decoding circuits to the second common voltage level, wherein the plurality of rows within the memory array are deselected.

16. The method of claim 10, wherein said step of simultaneously setting the inputs of the plurality of column decoding circuits to the first common voltage level comprises simultaneously setting the inputs of the plurality of column decoding circuits to a high voltage level.

17. The method of claim 16, wherein said step of simultaneously setting the inputs of the plurality of column decoding circuits to the second common voltage level comprises simultaneously setting the inputs of the plurality of column decoding circuits to a low voltage level.

18. A method for stress testing decoders and periphery circuits used with a memory array in an integrated circuit, comprising the steps of:

simultaneously setting the inputs of a plurality of column decoding circuits to a first common voltage level, wherein a plurality of bit and complementary bit lines within the memory array are selected for a predetermined period of time and simultaneously setting the inputs of a plurality of row decoding circuits to the first common voltage level, wherein a plurality of rows within the memory array are selected for a predetermined period of time;

applying a stress voltage to the integrated circuit;

simultaneously setting the inputs of the plurality of column decoding circuits to a second common voltage level, wherein the plurality of bit and complementary bit lines within the memory array are deselected; and applying a stress voltage to the integrated circuit;

wherein said steps of setting the inputs of a plurality of row decoding circuits or column decoding circuits are performed when the stress voltage is set to a low voltage level.

19. A method for stress testing decoders and periphery circuits used with a memory array in an integrated circuit, comprising the steps of:

simultaneously setting the inputs of a plurality of row decoding circuits to a first common voltage level, wherein a plurality of rows within the memory array are selected for a predetermined period of time;

simultaneously setting the inputs of a plurality of column decoding circuits to a second common voltage level, wherein a plurality of bit and complementary bit lines within the memory array are selected for the predetermined period of time;

applying a stress voltage to the integrated circuit;

simultaneously setting the inputs of the plurality of row decoding circuits to a third common voltage level, wherein the plurality of rows within the memory array are deselected;

simultaneously setting the inputs of the plurality of column decoding circuits to a fourth common voltage level, wherein the plurality of bit and complementary bit lines within the memory array are deselected; and applying a stress voltage to the integrated circuit.

20. The method of claim 19, further comprising the step of placing the integrated circuit in a test or special operating mode prior to performing the step of simultaneously setting the inputs of a plurality of row decoding circuits to a first common voltage level.

21. The method of claim 19, wherein said step of simultaneously setting the inputs of a plurality of row decoding circuits to the first common voltage level comprises simultaneously setting the inputs of a plurality of row decoding circuits to a low voltage level.

22. The method of claim 19, wherein said step of simultaneously setting the inputs of a plurality of column decoding circuits to the second common voltage level comprises simultaneously setting the inputs of a plurality of column decoding circuits to a low voltage level.

23. The method of claim 19, wherein said step of simultaneously setting the inputs of a plurality of row decoding circuits to the third common voltage level comprises simultaneously setting the inputs of a plurality of row decoding circuits to a high voltage level.

24. The method of claim 19, wherein said step of simultaneously setting the inputs of a plurality of column decoding circuits to the fourth common voltage level comprises simultaneously setting the inputs of a plurality of column decoding circuits to a high voltage level.

25. The method of claim 19, wherein a bit line load of a bit line pair is turned off during selection of a plurality of rows.

26. The method of claim 25, wherein the bit line load is pulled to ground after being turned off.

27. The method of claim 19, wherein said steps of setting the inputs of a plurality of row decoding circuits or column decoding circuits are performed when the stress voltage is set to a low voltage level.

* * * * *